(12) United States Patent
Peng et al.

(10) Patent No.: US 10,963,019 B2
(45) Date of Patent: Mar. 30, 2021

(54) ELECTRONIC DEVICE WITH CIRCUIT BOARD AND HINGE THEREIN

(71) Applicants: Ming-Chung Peng, Taipei (TW); Ko-Fan Chen, Taipei (TW); Chun-Yi Ho, Taipei (TW); Chien-Ting Lin, Taipei (TW); Yu-Jung Liu, Taipei (TW); Hsin-Jung Lee, Taipei (TW); Hsin-Yu Huang, Taipei (TW); Jih-Houng Lee, Taipei (TW); Ming-Feng Liu, Taipei (TW); Kuo-Jung Wu, Taipei (TW); Kuo-Pin Chen, Taipei (TW); Chia-Ling Lee, Taipei (TW); Jing-Jie Lin, Taipei (TW)

(72) Inventors: Ming-Chung Peng, Taipei (TW); Ko-Fan Chen, Taipei (TW); Chun-Yi Ho, Taipei (TW); Chien-Ting Lin, Taipei (TW); Yu-Jung Liu, Taipei (TW); Hsin-Jung Lee, Taipei (TW); Hsin-Yu Huang, Taipei (TW); Jih-Houng Lee, Taipei (TW); Ming-Feng Liu, Taipei (TW); Kuo-Jung Wu, Taipei (TW); Kuo-Pin Chen, Taipei (TW); Chia-Ling Lee, Taipei (TW); Jing-Jie Lin, Taipei (TW)

(73) Assignee: COMPAL ELECTRONICS, INC., Taipei (TW)

(*) Notice: Subject to any disclaimer, the term of this patent is extended or adjusted under 35 U.S.C. 154(b) by 0 days.

(21) Appl. No.: 16/747,534

(22) Filed: Jan. 21, 2020

(65) Prior Publication Data

US 2020/0387200 A1 Dec. 10, 2020

Related U.S. Application Data

(60) Provisional application No. 62/857,250, filed on Jun. 4, 2019.

(51) Int. Cl.
*G06F 1/16* (2006.01)
*H05K 1/18* (2006.01)

(52) U.S. Cl.
CPC .......... *G06F 1/1681* (2013.01); *H05K 1/189* (2013.01); *H05K 2201/10128* (2013.01)

(58) Field of Classification Search
CPC ...................................................... G06F 1/16
See application file for complete search history.

(56) References Cited

U.S. PATENT DOCUMENTS 6,125,029 A    9/2000 Sasaki et al.
7,322,835 B2 * 1/2008 Lin ..................... H01R 13/6275
                                                        439/100

(Continued)

OTHER PUBLICATIONS

"Office Action of Taiwan Counterpart Application", dated Jul. 23, 2020, p. 1-p. 7.

*Primary Examiner* — Jerry Wu
(74) *Attorney, Agent, or Firm* — JCIPRNET

(57) ABSTRACT

An electronic device includes a first body, a second body, two hinges, and at least one electronic assembly. The two hinges are connected between the first body and the second body, and the first body and the second body are adapted to rotate relatively through the two hinges. The electronic assembly is connected to the second body and is located between the two hinges.

25 Claims, 14 Drawing Sheets

(56) References Cited

U.S. PATENT DOCUMENTS

| | | | |
|---|---|---|---|
| 8,823,870 B2* | 9/2014 | Tsai | G06F 1/1686 |
| | | | 348/373 |
| 2014/0307380 A1 | 10/2014 | Nakamura et al. | |
| 2019/0121394 A1 | 4/2019 | Lang et al. | |

* cited by examiner

ELECTRONIC DEVICE WITH CIRCUIT BOARD AND HINGE THEREIN

CROSS-REFERENCE TO RELATED APPLICATION

This application claims the benefit of U.S. provisional application Ser. No. 62/857,250, filed on Jun. 4, 2019. The entirety of the above-mentioned patent application is hereby incorporated by reference herein and made a part of this specification.

BACKGROUND

Technical Field

The disclosure relates to an electronic device, and in particular, to an electronic device including a plurality of bodies.

Description of Related Art

Notebook computers (NB) have been popular in the consumers' market for a long time. A screen of an NB includes a display panel, and an end of the display panel is usually connected to a control board. Most control boards extend toward a rear end of the NB along a direction parallel to a display surface, and therefore, a width of the NB in this direction is increased. To resolve the problem, the control boards of some NBs are folded back to overlap the back of the display panel. However, this increases the overall thickness of the NB.

SUMMARY

The disclosure provides an electronic device having a relatively small overall size.

The electronic device provided in an embodiment of the disclosure includes a first body, a second body, two hinges, and at least one electronic assembly. The two hinges are connected between the first body and the second body, and the first body and the second body are adapted to rotate relatively through the two hinges. The electronic assembly is connected to the second body and is located between the two hinges.

In an embodiment of the disclosure, the second body includes a display panel.

In an embodiment of the disclosure, the at least one electronic assembly includes a control circuit board and a flexible printed circuit (FPC), and two ends of the FPC are respectively connected to the control circuit board and the display panel.

In an embodiment of the disclosure, a region between the two ends of the foregoing FPC is separated from the control circuit board.

In an embodiment of the disclosure, the control circuit board bends relative to the display panel through single bending of the FPC.

In an embodiment of the disclosure, an extension length of the FPC from the display panel to the control circuit board is less than or equal to an extension length of the control circuit board along a direction away from the FPC.

In an embodiment of the disclosure, each side edge of the control circuit board is a flat surface.

In an embodiment of the disclosure, the control circuit board includes a through hole, and the FPC does not penetrate the through hole.

In an embodiment of the disclosure, an angle between an extension direction of the control circuit board and an extension direction of the display panel is 45 degrees to 100 degrees.

In an embodiment of the disclosure, the control circuit board includes a top edge and a bottom edge, the top edge is close to the display panel, and the bottom edge is away from the display panel.

In an embodiment of the disclosure, the FPC is connected to the display panel from the control circuit board through the top edge.

In an embodiment of the disclosure, the second body includes a back cover and a front frame, and the display panel is disposed between the back cover and the front frame and is exposed by the front frame.

In an embodiment of the disclosure, the control circuit board is secured to the front frame.

In an embodiment of the disclosure, the control circuit board includes a display control panel.

In an embodiment of the disclosure, the display panel includes a touch panel.

In an embodiment of the disclosure, the control circuit board includes a touch control board.

In an embodiment of the disclosure, the second body includes a lock assembly, connected to the display panel, and the control circuit board is locked to the lock assembly.

In an embodiment of the disclosure, the lock assembly is L-shaped.

In an embodiment of the disclosure, the lock assembly bends at an angle of 45 degrees to 100 degrees.

In an embodiment of the disclosure, the front frame includes a main housing and a hinge cover, and the hinge cover is connected to the main housing.

In an embodiment of the disclosure, the control circuit board is attached to or engaged with the hinge cover.

In an embodiment of the disclosure, the control circuit board is attached to or engaged with the main housing.

In an embodiment of the disclosure, the second body includes a receiving groove, configured to receive the control circuit board, the FPC, and at least a portion of the two hinges.

In an embodiment of the disclosure, an end of the display panel extends into the receiving groove.

In an embodiment of the disclosure, the at least one electronic assembly includes a button, an antenna, a speaker, a camera lens, or a gesture sensor.

In an embodiment of the disclosure, the first body is a logic unit or a stand.

In an embodiment of the disclosure, the at least one electronic assembly includes an L-shaped circuit board.

In an embodiment of the disclosure, the L-shaped circuit board bends at an angle of 45 degrees to 100 degrees.

In an embodiment of the disclosure, the control circuit board is located between the two hinges.

In an embodiment of the disclosure, a side end face of the control circuit board overlaps side end faces of the two hinges.

Based on the above, in the electronic device provided in one or more embodiments of the disclosure, the electronic assembly is disposed between the two hinges, so that the electronic assembly is accommodated in an existing internal space of the electronic device. As such, the electronic assembly is arranged in a way not to increase the overall size of the electronic device.

Several exemplary embodiments accompanied with figures are described in detail below to further describe the disclosure in details.

BRIEF DESCRIPTION OF THE DRAWINGS

The accompanying drawings are included to provide further understanding, and are incorporated in and constitute a part of this specification. The drawings illustrate exemplary embodiments and, together with the description, serve to explain the principles of the disclosure.

DESCRIPTION OF THE EMBODIMENTS

Figure 1:
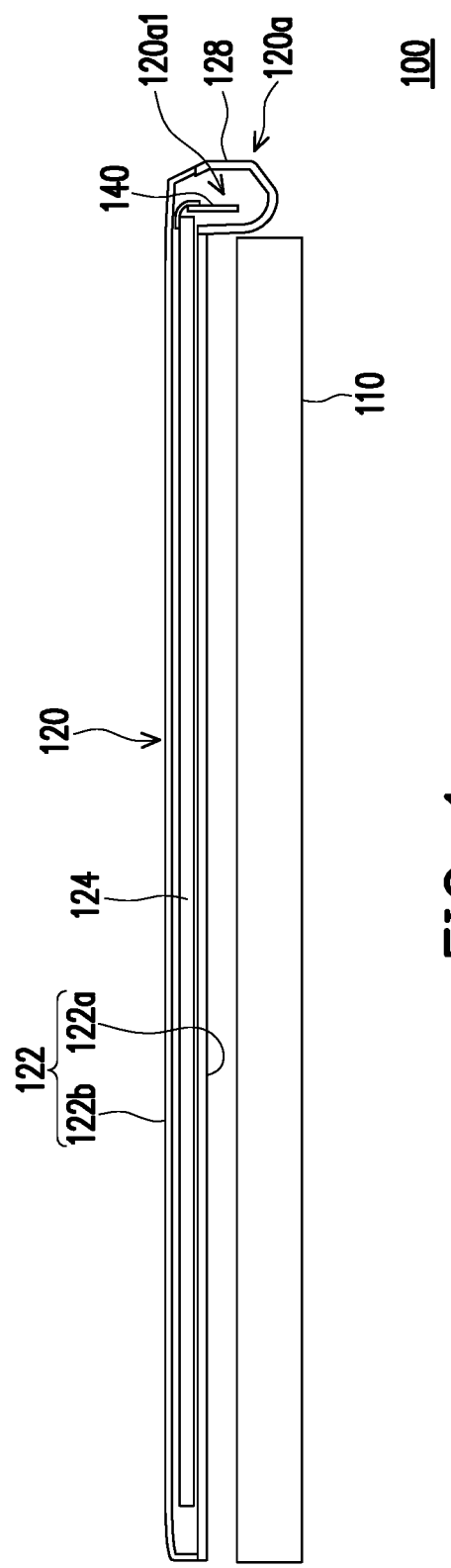
FIG. 1 is a schematic cross-sectional view of some components of an electronic device according to an embodiment of the disclosure.

Reference will now be made in detail to the present preferred embodiments of the disclosure, examples of which are illustrated in the accompanying drawings. Wherever possible, the same reference numbers are used in the drawings and the description to refer to the same or like parts.

Figure 2:
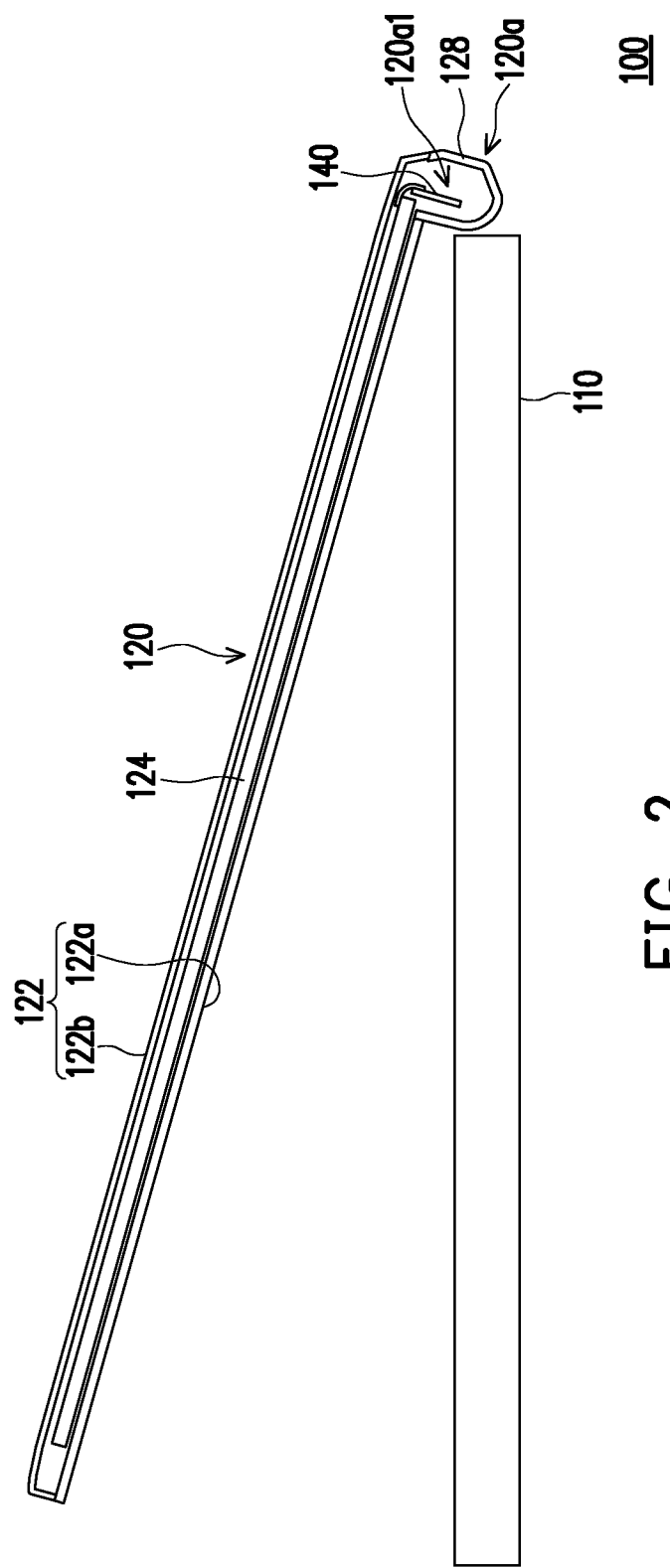
FIG. 2 illustrates that a first body and a second body in FIG. 1 relatively rotate.

FIG. 1 is a schematic cross-sectional view of some components of an electronic device according to an embodiment of the disclosure. FIG. 2 illustrates that a first body and a second body in FIG. 1 relatively rotate. Referring to FIG. 1 and FIG. 2, an electronic device 100 in the present embodiment is, for example, an NB and includes a first body 110 and a second body 120. The first body 110 is, for example, a host (that is, a logic unit) of the NB. The second body 120 is, for example, a screen of the NB and includes a main housing 122 and a display panel 124. The main housing 122 includes a front frame 122a and a back cover 122b. The display panel 124 is disposed in the main housing 122, is located between the front frame 122a and the back cover 122b, and is exposed by the front frame 122a. As shown in FIG. 2, the second body 120 may be expanded relative to the first body 110. In other embodiments, the electronic device 100 may be alternatively a tablet computer, and in this case, the first body 110 is, for example, a stand of the tablet computer.

Figure 3:
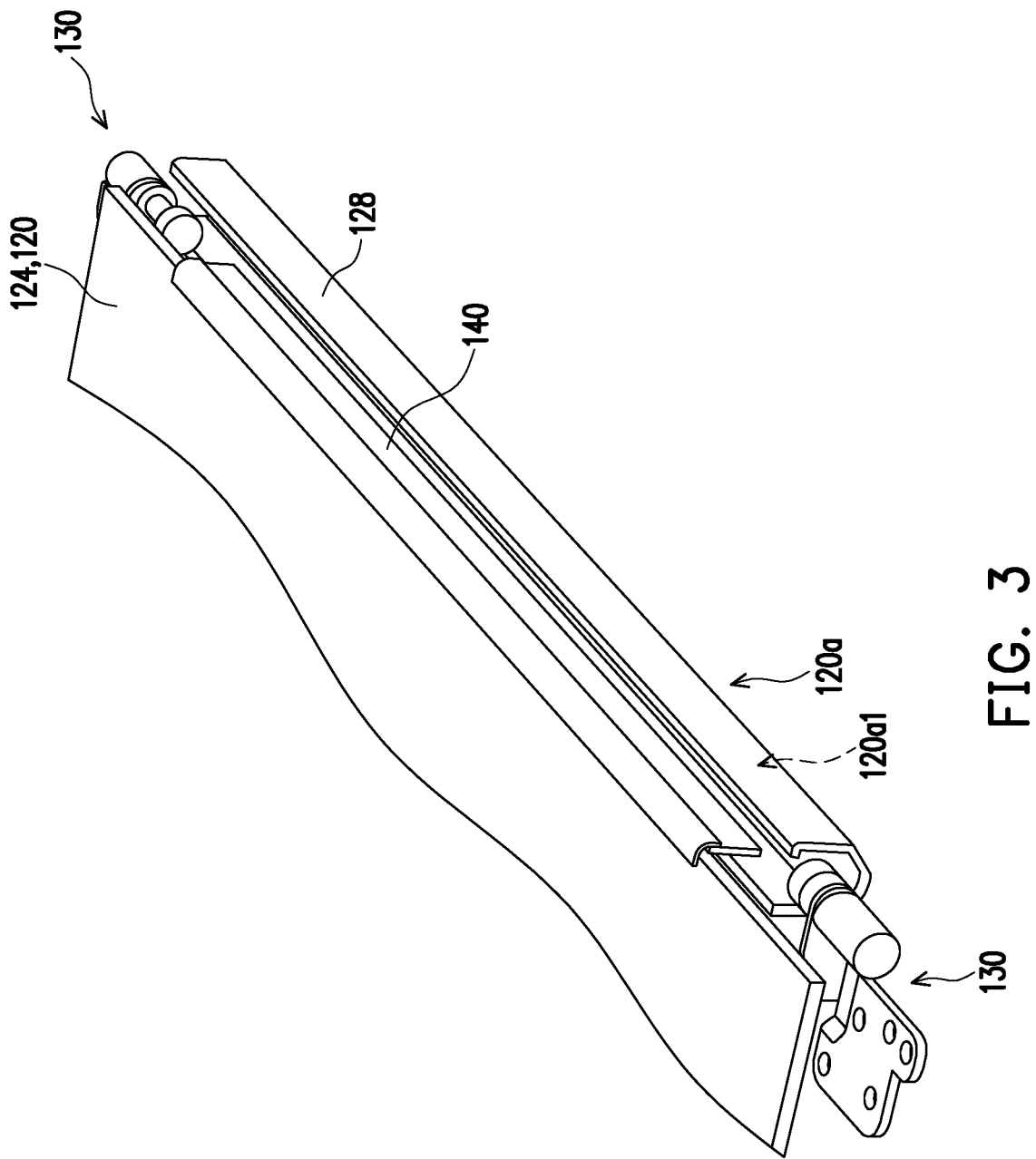
FIG. 3 is a three-dimensional view of some components of the electronic device in FIG. 1.
Figure 4:
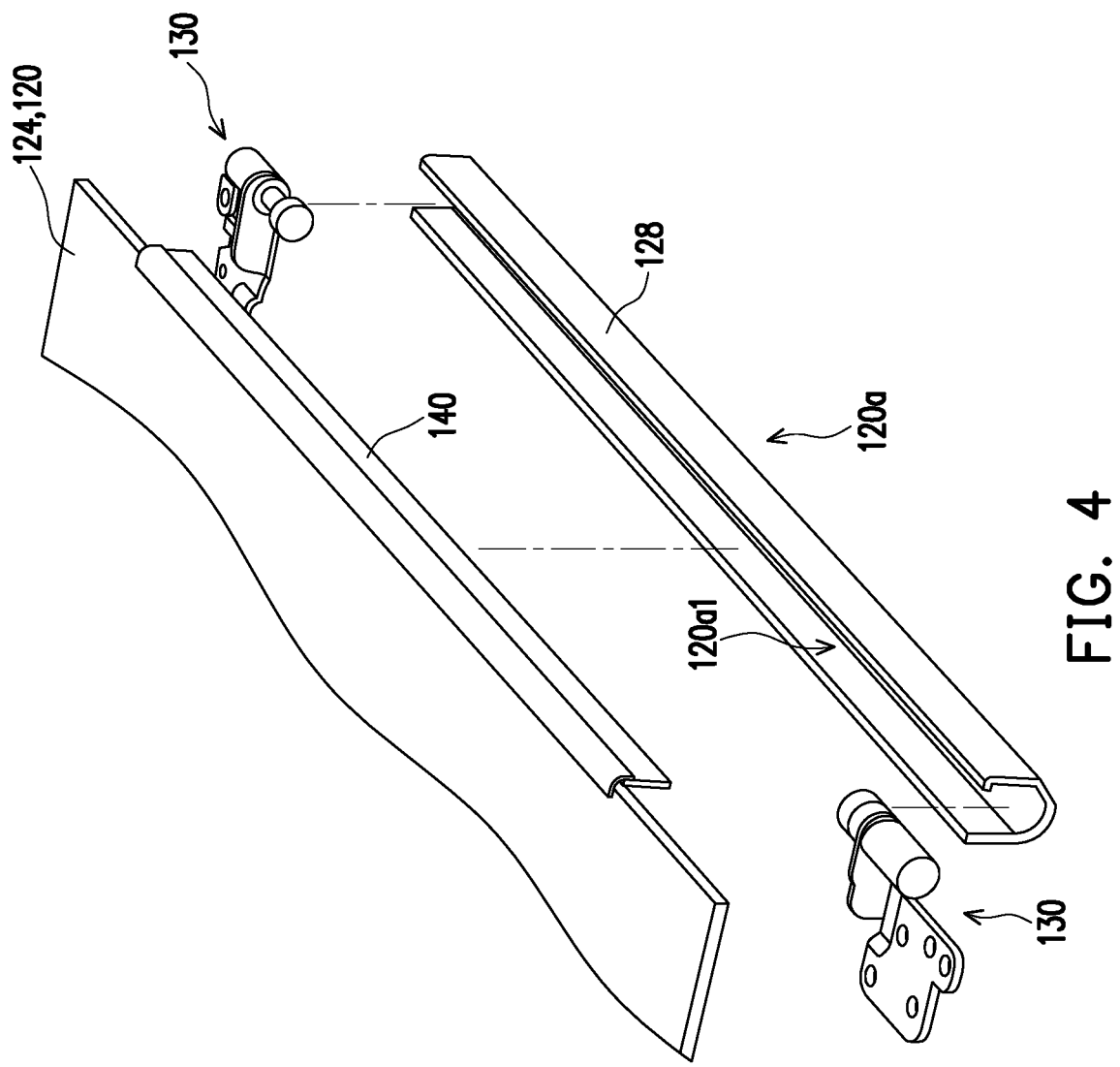
FIG. 4 is an exploded view of the electronic device in FIG. 3.

FIG. 3 is a three-dimensional view of some components of the electronic device in FIG. 1. FIG. 4 is an exploded view of the electronic device in FIG. 3. Referring to FIG. 3 and FIG. 4, the electronic device 100 in the present embodiment further includes two hinges 130 and an electronic assembly 140. The two hinges 130 are connected between the first body 110 (shown in FIG. 1) and the main housing 122 (shown in FIG. 1) of the second body 120. The first body 110 and the second body 120 are adapted to rotate relatively through the two hinges 130, so that the second body 120 is expanded as described above. The electronic assembly 140 is connected to the second body 120 and is located between the two hinges 130. The electronic assembly 140 is, for example, connected to the display panel 124 and serves as a display control panel of the display panel 124.

As described above, the electronic assembly 140 is disposed between the two hinges 130, so that the electronic assembly 140 can be accommodated in an existing internal space of the electronic device 100. As such, the electronic assembly 140 is arranged in a way not to increase an overall size of the electronic device 100. Specifically, the electronic assembly 140 is disposed between the two hinges 130, so that the electronic assembly 140 does not increase an overall size of the electronic device 100 in a direction D1 (shown in FIG. 5) parallel to a display surface 124a of the display panel 124.

Figure 5:
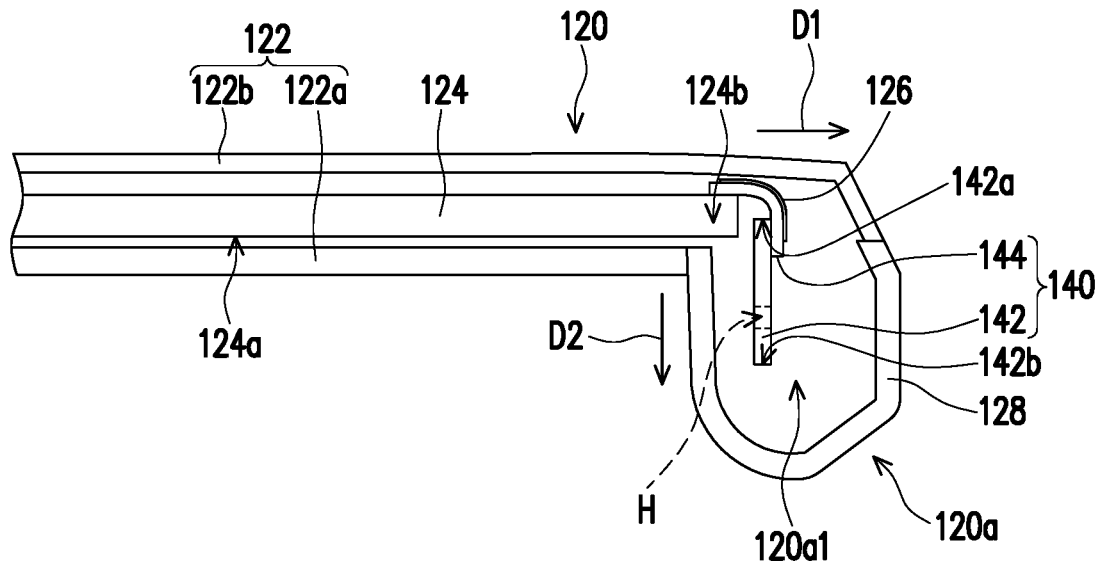
FIG. 5 is an enlarged partial view of the electronic device in FIG. 1.

FIG. 5 is an enlarged partial view of the electronic device in FIG. 1. Referring to FIG. 5, specifically, the electronic assembly 140 in the present embodiment includes a control circuit board 142 and an FPC 144, and two ends of the FPC 144 are respectively connected to the control circuit board 142 and the display panel 124 of the second body 120. A region between the two ends of the FPC 144 is separated from the control circuit board 142. An extension length of the FPC 144 from the display panel 124 of the second body 120 to the control circuit board 142 is less than or equal to an extension length of the control circuit board 142 along a direction away from the FPC 144. Each side edge of the control circuit board 142 is a flat surface without gaps. The control circuit board 142 includes a top edge 142a and a bottom edge 142b, the top edge 142a is close to the display panel 124, and the bottom edge 142b is away from the display panel 124. The FPC 144 is connected to the display panel 124 from the control circuit board 142 through the top edge 142a. In addition, in some embodiments, the control circuit board 142 may, as shown in FIG. 5, include a through hole H, and the FPC 144 does not penetrate the through hole H. The electronic assembly 140 bends relative to the display panel 124 of the second body 120 through single bending of the FPC 144, so that the electronic assembly 140 does not increase the overall size of the electronic device 100 in the direction D1 parallel to the display surface 124a of the display panel 124. For example, an angle between an extension direction D2 of the control circuit board 142 of the electronic assembly 140 and the extension direction D1 of the display panel 124 may be 80 degrees to 100 degrees, or may be 45 degrees to 80 degrees, to further reduce the size of the electronic device 100 in the direction D1 without increasing a size of the electronic device 100 in the direction D2. The control circuit board 142 of the electronic assembly 140 is, for example, connected to the display panel 124 and serves as a display control panel of the display panel 124. A side end face of the control circuit board 142 overlaps side end faces of the two hinges 130. In other embodiments, the electronic assembly 140 may include an L-shaped circuit board that bends at an angle of 45 degrees to 100 degrees. The side end face of the control circuit board 142 does not overlap the side end faces of the two hinges 130.

In addition, the second body 120 further includes a lock assembly 126, the lock assembly 126 is, for example, an L-shaped sheet metal member, and is connected to the display panel 124, and the control circuit board 142 of the electronic assembly 140 is locked to the lock assembly 126 for fixation, to prevent the electronic assembly 140 from producing unexpected displacement during rotation of the second body 120 relative to the first body 110. In addition, during shipment and delivery of the electronic device 100, the lock assembly 126 can protect the FPC 144 against line damage. In the present embodiment, the lock assembly 126 bends at an angle of, for example, 45 degrees to 100 degrees.

In the present embodiment, the second body 120 includes a masking portion 120a. The masking portion 120a includes a receiving groove 120a1, and the receiving groove 120a1 receives the control circuit board 142, the FPC 144, and at least a portion of the two hinges 130, so that the masking portion 120a, as shown in FIG. 3, masks at least a portion of the two hinges 130, and the electronic assembly 140 is at least partially located in the masking portion 120a. Specifically, the second body 120 further includes a hinge cover 128. The hinge cover 128 is connected between the front frame 122a and the back cover 122b, and the hinge cover 128 constitutes the masking portion 120a and the receiving groove 120a1 of the masking portion 120a. The electronic device 100 of the present embodiment, as described above, uses the existing hinge cover 128 for masking the hinge 130 to receive the electronic assembly 140, instead of adding a disposition space to receive the electronic assembly 140, and therefore, the overall device size is not increased due to the disposition of the electronic assembly 140. In addition, in the present embodiment, as shown in FIG. 5, an end 124b of the display panel 124 extends into an opening of the receiving groove 120a1 and is located inside the receiving groove 120a1, so that the electronic assembly 140 connected to the end 124b of the display panel 124 easily extends into the receiving groove 120a1. Moreover, in the present embodiment, the hinge cover 128 and the front frame 122a are not of an integrated structure. Therefore, when needing to be in different colors due to design requirements, the hinge cover 128 and the front frame 122a may be respectively sprayed first and then assembled together, without needing to use a spray masking groove to achieve color separation, thereby simplifying the process. In addition, the hinge cover 128 and the front frame 122a are not in an integrated structure, and therefore, are easy to assembly and maintain.

In other embodiments, the control circuit board 142 of the electronic assembly 140 may be secured to the main housing 122 of the second body 120 or the hinge cover 128, and this is described above by way of example by using figures.

Figure 6:
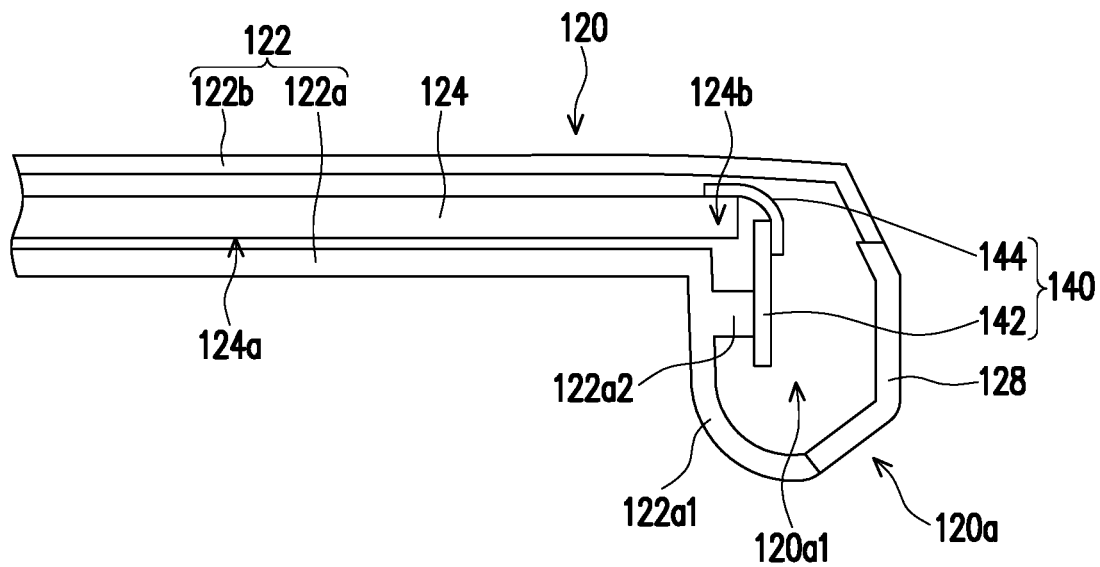
FIG. 6 is an enlarged partial view of an electronic device according to another embodiment of the disclosure.

FIG. 6 is an enlarged partial view of an electronic device according to another embodiment of the disclosure. A difference between the embodiment shown in FIG. 6 and the embodiment shown in FIG. 5 lies in that, the front frame 122a in FIG. 6 includes an extension portion 122a1, and the extension portion 122a1 and the hinge cover 128 jointly constitute the masking portion 120a. The front frame 122a includes a protruding structure 122a2 at the extension portion 122a1, and the control circuit board 142 of the electronic assembly 140 is attached to the protruding structure 122a2 to be secured to the front frame 122a. In this way, the lock assembly 126 shown in FIG. 5 does not need to be disposed.

Figure 7:
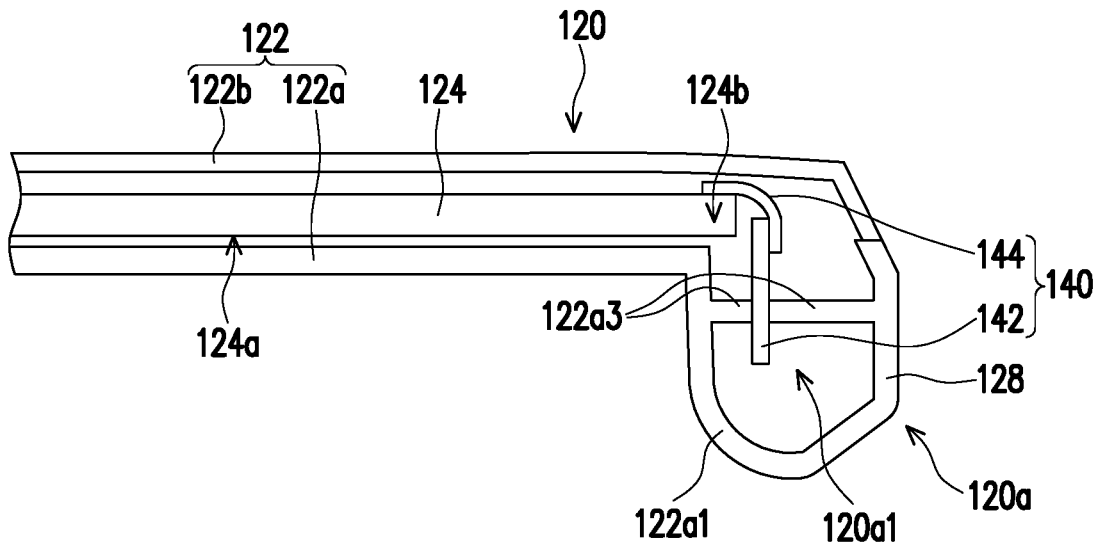
FIG. 7 is an enlarged partial view of an electronic device according to another embodiment of the disclosure.

FIG. 7 is an enlarged partial view of an electronic device according to another embodiment of the disclosure. A difference between the embodiment shown in FIG. 7 and the embodiment shown in FIG. 6 lies in that, the hinge cover 128 in FIG. 6 is not disposed in the embodiment of FIG. 7, but instead, the extension portion 122a1 of the front frame 122a further extends to be directly connected to the back cover 122b, the extension portion 122a1 constitutes the masking portion 120a, the front frame 122a includes an engagement structure 122a3 at the extension portion 122a1, and the electronic assembly 140 is engaged with the engagement structure 122a3 for fixation. In the present embodiment, the extension portion 122a1 of the front frame 122a is used to replace the hinge cover 128 in the foregoing embodiment, and therefore, mold costs can be reduced. In addition, no assembly gap exists between the front frame 122a and the hinge cover 128, thereby further reducing the overall device size in the direction D1 (as shown in FIG. 5).

Figure 8:
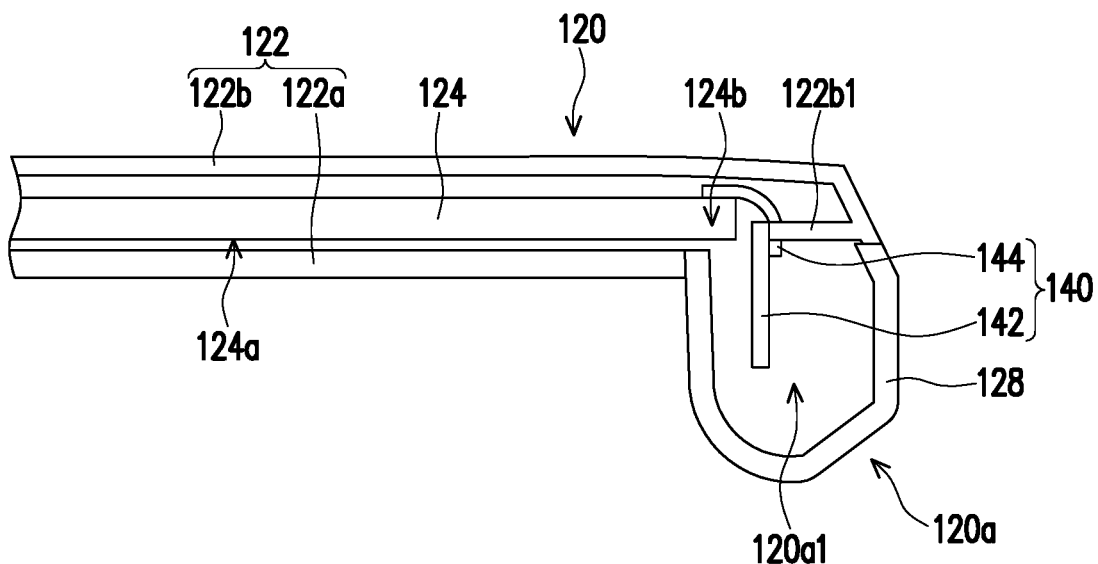
FIG. 8 is an enlarged partial view of an electronic device according to another embodiment of the disclosure.

FIG. 8 is an enlarged partial view of an electronic device according to another embodiment of the disclosure. A difference between the embodiment shown in FIG. 8 and the embodiment shown in FIG. 6 lies in that, the back cover 122b in FIG. 8 includes a protruding structure 122b1 at a position close to the electronic assembly 140, and the control circuit board 142 of the electronic assembly 140 is attached to the protruding structure 122b1 for fixation. In this way, the lock assembly 126 shown in FIG. 5 does not need to be disposed.

Figure 9:
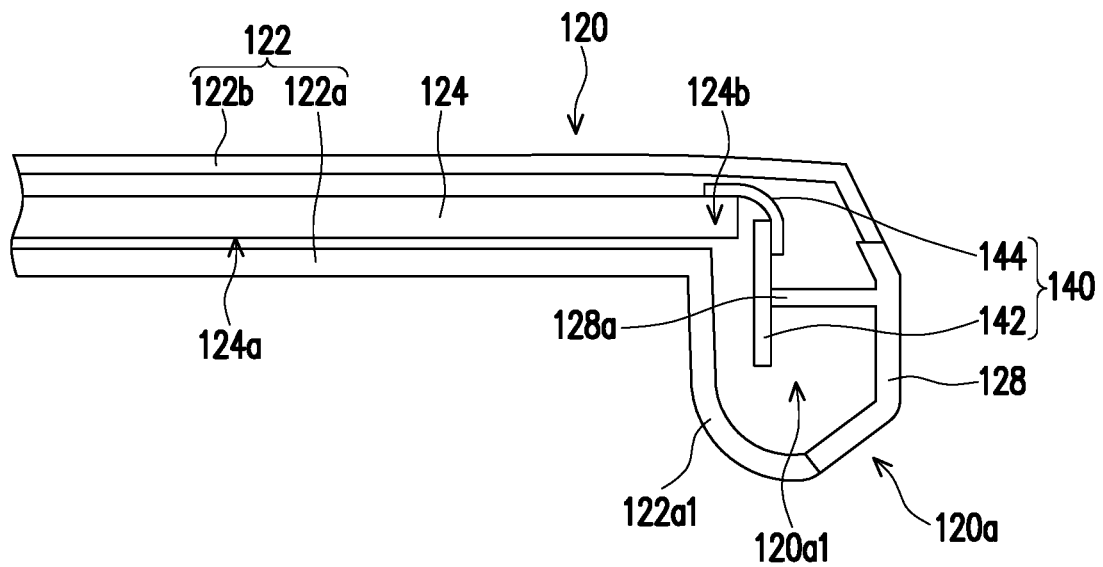
FIG. 9 is an enlarged partial view of an electronic device according to another embodiment of the disclosure.

FIG. 9 is an enlarged partial view of an electronic device according to another embodiment of the disclosure. A difference between the embodiment shown in FIG. 9 and the embodiment shown in FIG. 6 lies in that, the hinge cover 128 in FIG. 9 includes a protruding structure 128a, and the control circuit board 142 of the electronic assembly 140 is attached to the protruding structure 128a for fixation. In this way, the protruding structure 122a2 shown in FIG. 6 does not need to be disposed.

Figure 10:
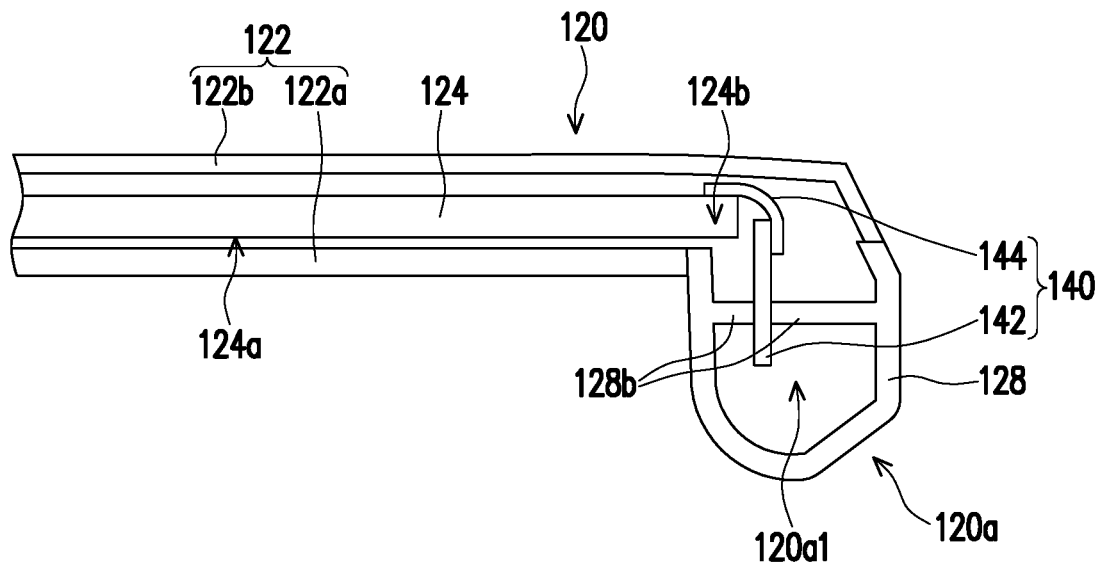
FIG. 10 is an enlarged partial view of an electronic device according to another embodiment of the disclosure.

FIG. 10 is an enlarged partial view of an electronic device according to another embodiment of the disclosure. A difference between the embodiment shown in FIG. 10 and the embodiment shown in FIG. 5 lies in that, the hinge cover 128 in FIG. 10 includes an engagement structure 128b, and the control circuit board 142 of the electronic assembly 140 is engaged with the engagement structure 128b for fixation. In this way, the lock assembly 126 shown in FIG. 5 does not need to be disposed.

Figure 11:
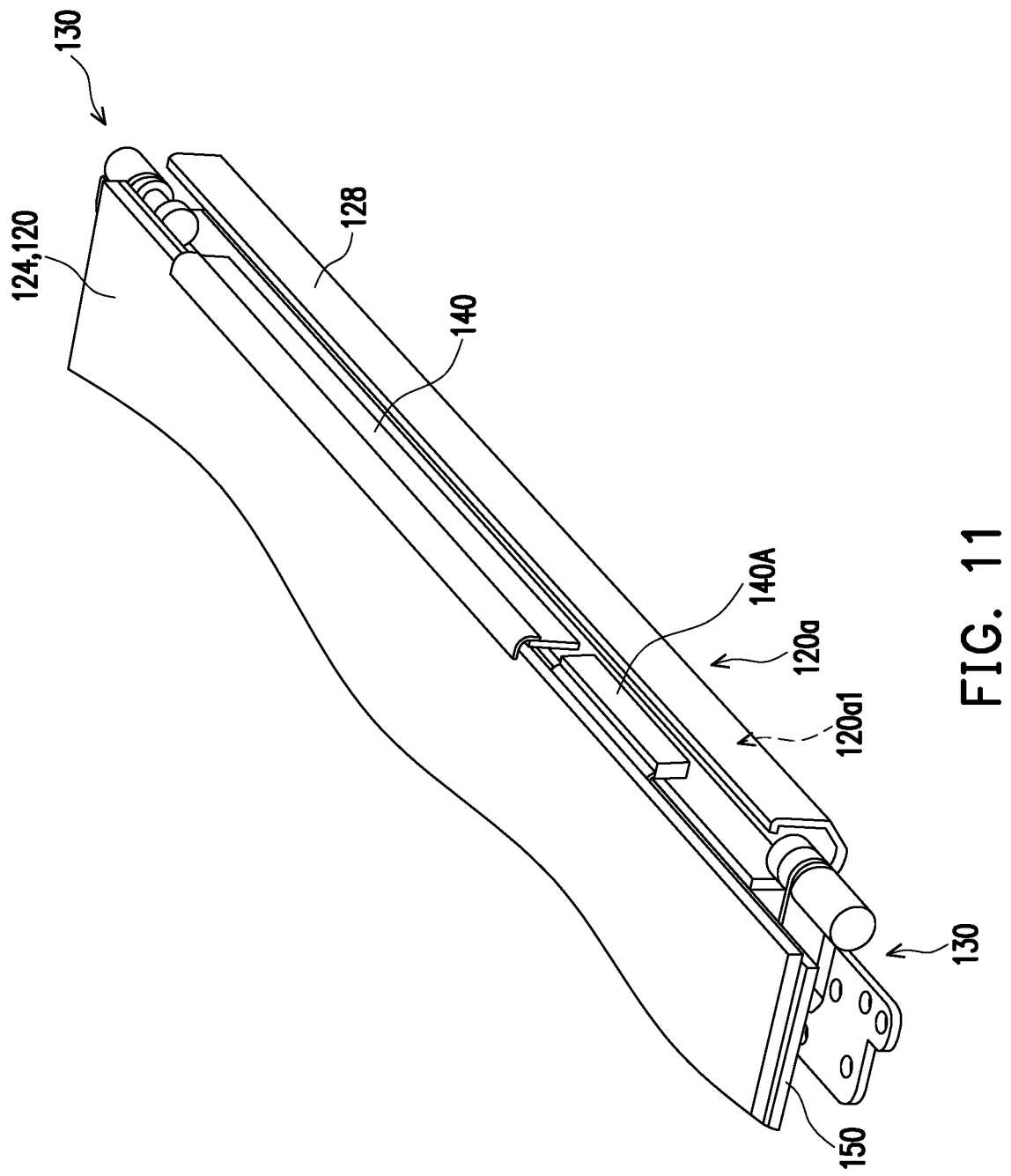
FIG. 11 is a three-dimensional view of some components of an electronic device according to another embodiment of the disclosure.
Figure 12:
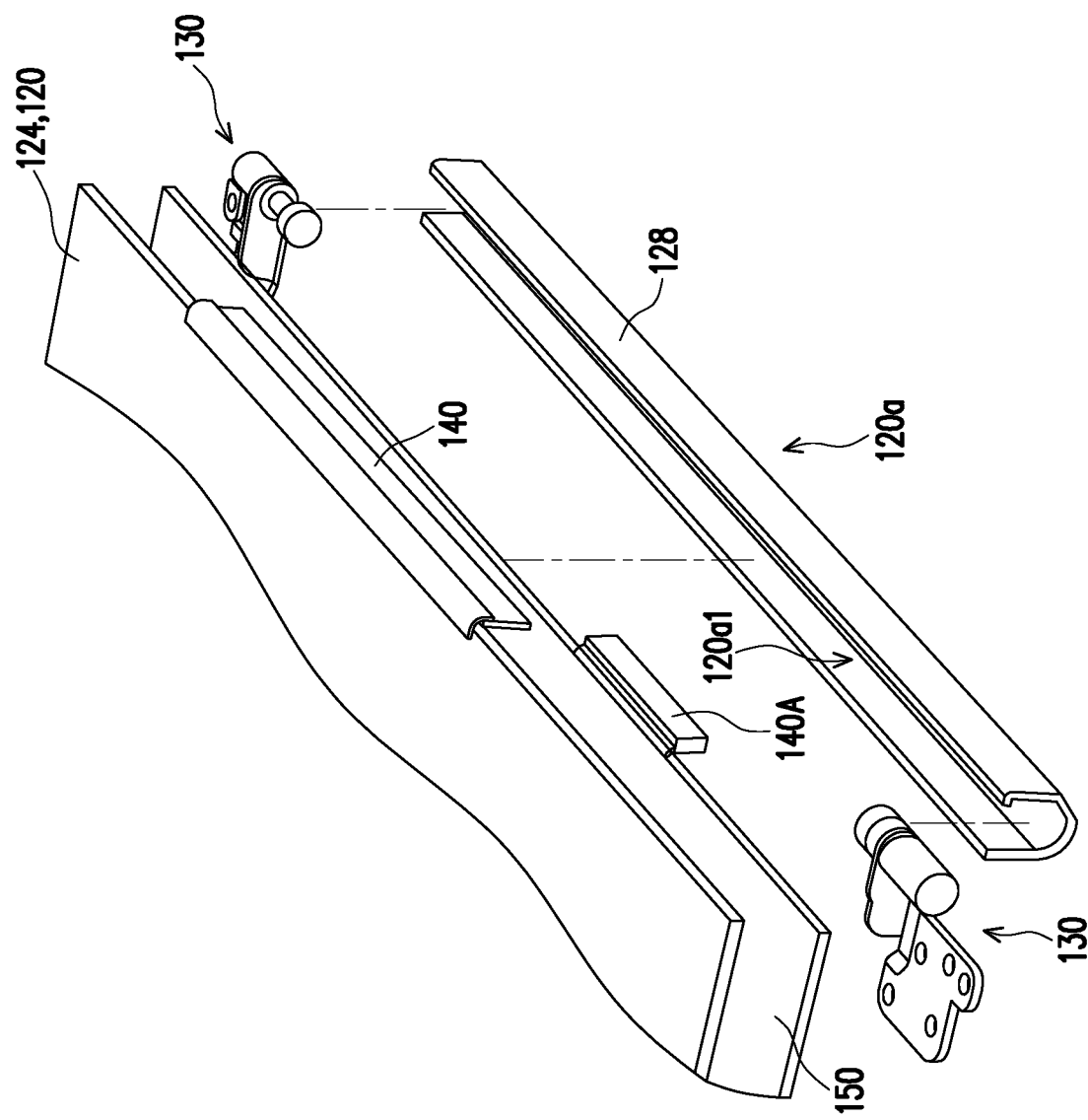
FIG. 12 is an exploded view of the electronic device in FIG. 11.

FIG. 11 is a three-dimensional view of some components of an electronic device according to another embodiment of the disclosure. FIG. 12 is an exploded view of the electronic device in FIG. 11. A difference between the embodiment shown in FIG. 11 and FIG. 12 and the embodiment shown in FIG. 3 and FIG. 4 lies in that, the display panel 124 in FIG. 11 and FIG. 12 includes a touch panel 150 and another electronic assembly 140A, the touch panel 150 is disposed overlapping the display panel 124, and a control circuit board 142 of the electronic assembly 140A is, for example, a touch control board and is connected to the touch panel 150 to be located between the two hinges 130 and inside the masking portion 120a. A fixation manner of the electronic assembly 140A may be the same as or similar to that of the electronic assembly 140 in any one of the foregoing embodiments, and details are not described herein again.

Fixation of the electronic assembly 140 and/or the electronic assembly 140A in the foregoing embodiments prevents the FPC 144 from repeatedly bending and easily shaking during use of the electronic device 100, thereby avoiding signal weakening or interruption, and increasing a service life of the display panel and/or the touch panel. In addition, the electronic assembly 140 and/or the electronic assembly 140A are secured inside the masking portion 120a as described above without an assembly tolerance, so that the electronic assembly 140 and/or the electronic assembly 140A does not easily shake during use of the electronic device 100, thereby further increasing the service life of the display panel and/or the touch panel.

Figure 13:
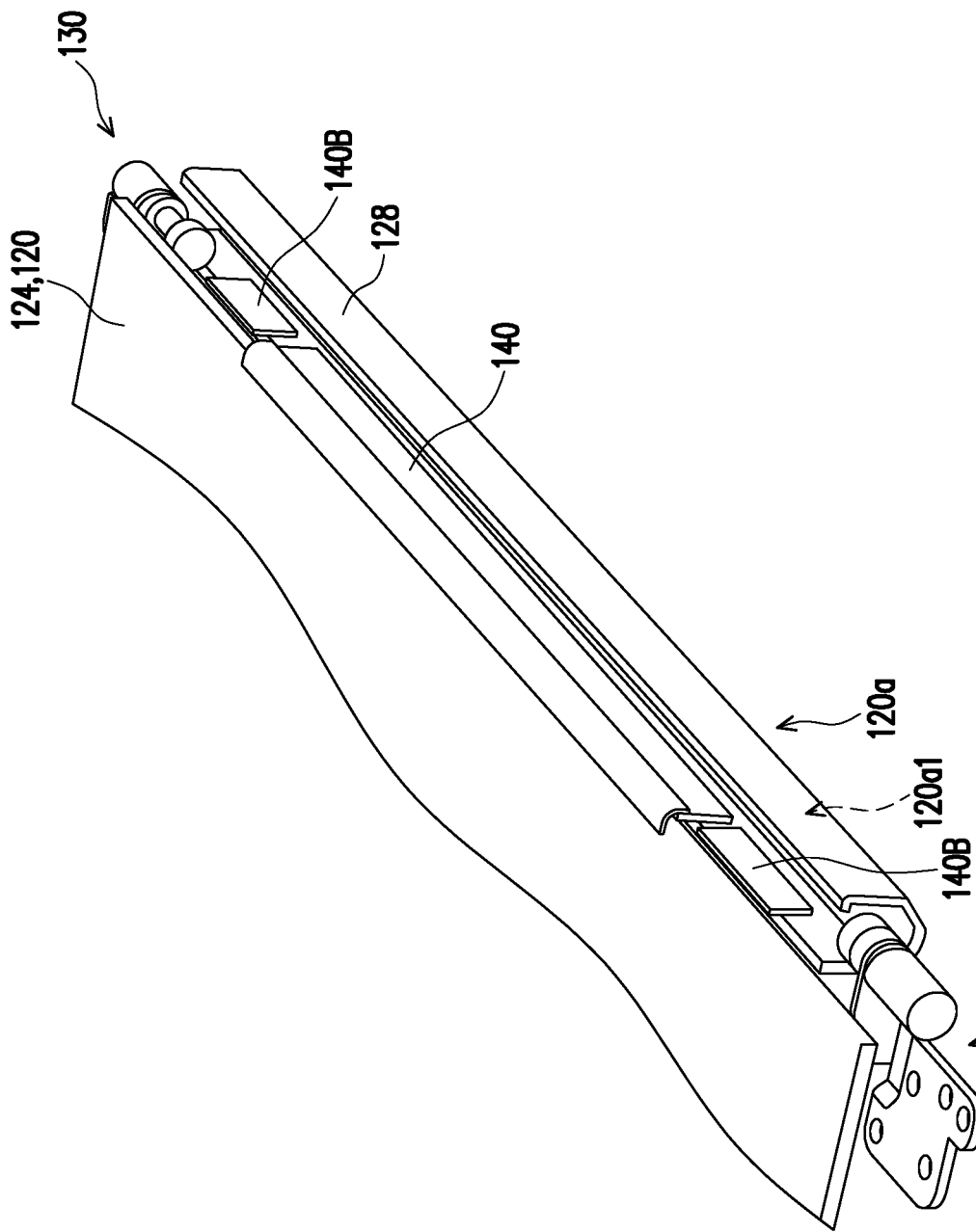
FIG. 13 is a three-dimensional view of some components of an electronic device according to another embodiment of the disclosure.
Figure 14:
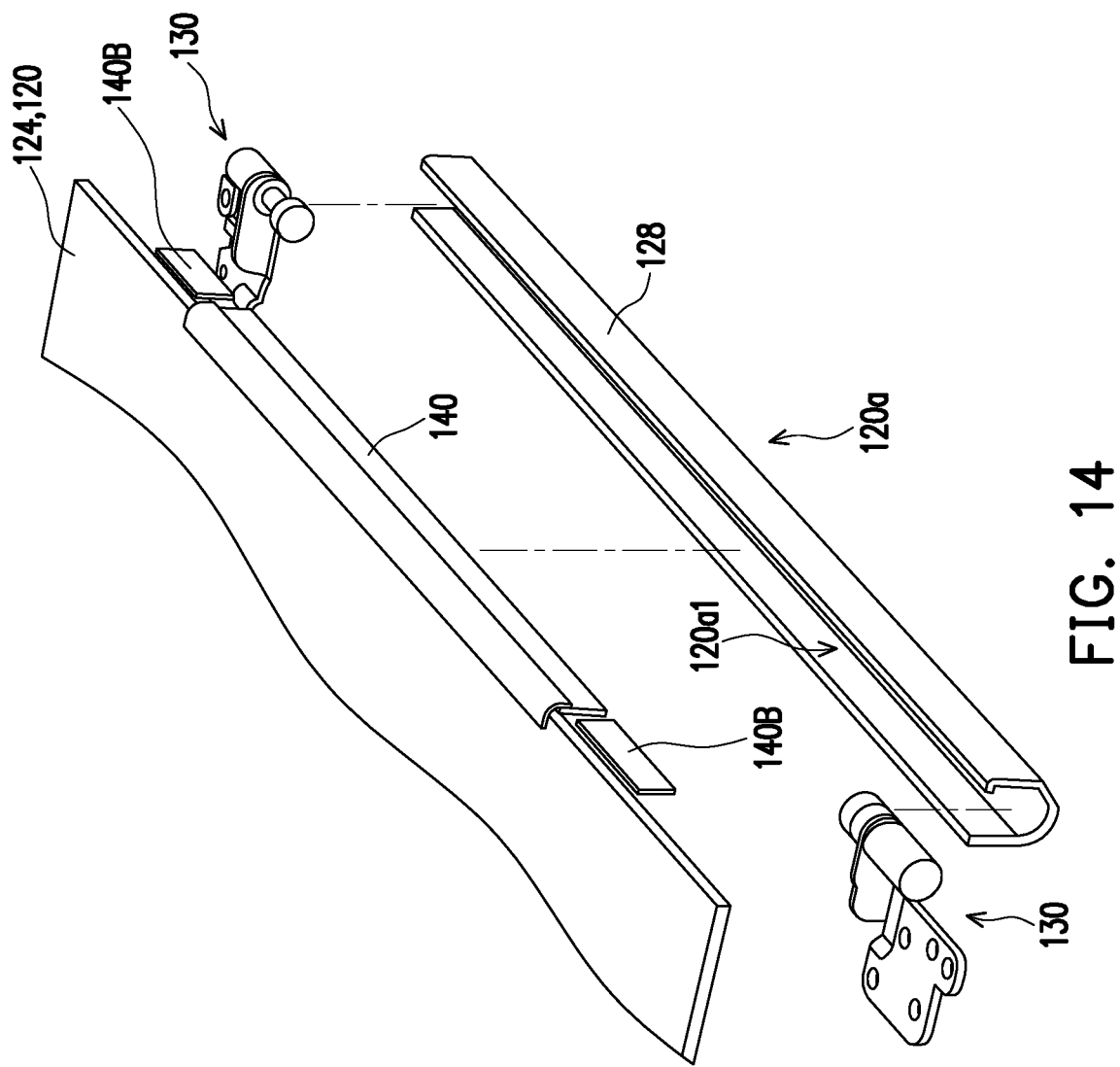
FIG. 14 is an exploded view of the electronic device in FIG. 13.

FIG. 13 is a three-dimensional view of some components of an electronic device according to another embodiment of the disclosure. FIG. 14 is an exploded view of the electronic device in FIG. 13. A difference between the embodiment shown in FIG. 13 and FIG. 14 and the embodiment shown in FIG. 3 and FIG. 4 lies in that, the electronic device in FIG. 13 and FIG. 14 further includes at least another electronic assembly 140B (there are two electronic assemblies 140B shown in the figure), and the electronic assembly 140B is, for example, an antenna and is disposed between the two hinges 130 to be located inside the masking portion 120a. A fixation manner of the electronic assembly 140B may be the same as or similar to that of the electronic assembly 140 in any one of the foregoing embodiments, and details are not described herein again. In addition, the antenna (the electronic assembly 140B) is disposed inside the masking portion 120a, so that materials of a housing of the first body 110 and a housing (for example, the main housing 122 described above) of the second body 120 do not affect signal reception of the antenna. Therefore, material selection for the housing of the first body 110 and the housing of the second body 120 is not limited. Moreover, the antenna (the electronic assembly 140B) and the control circuit board (the electronic assembly 140) are jointly secured inside the masking portion 120a, so that manufacturing costs can be reduced by using a same fixation structure for fixation.

Figure 15:
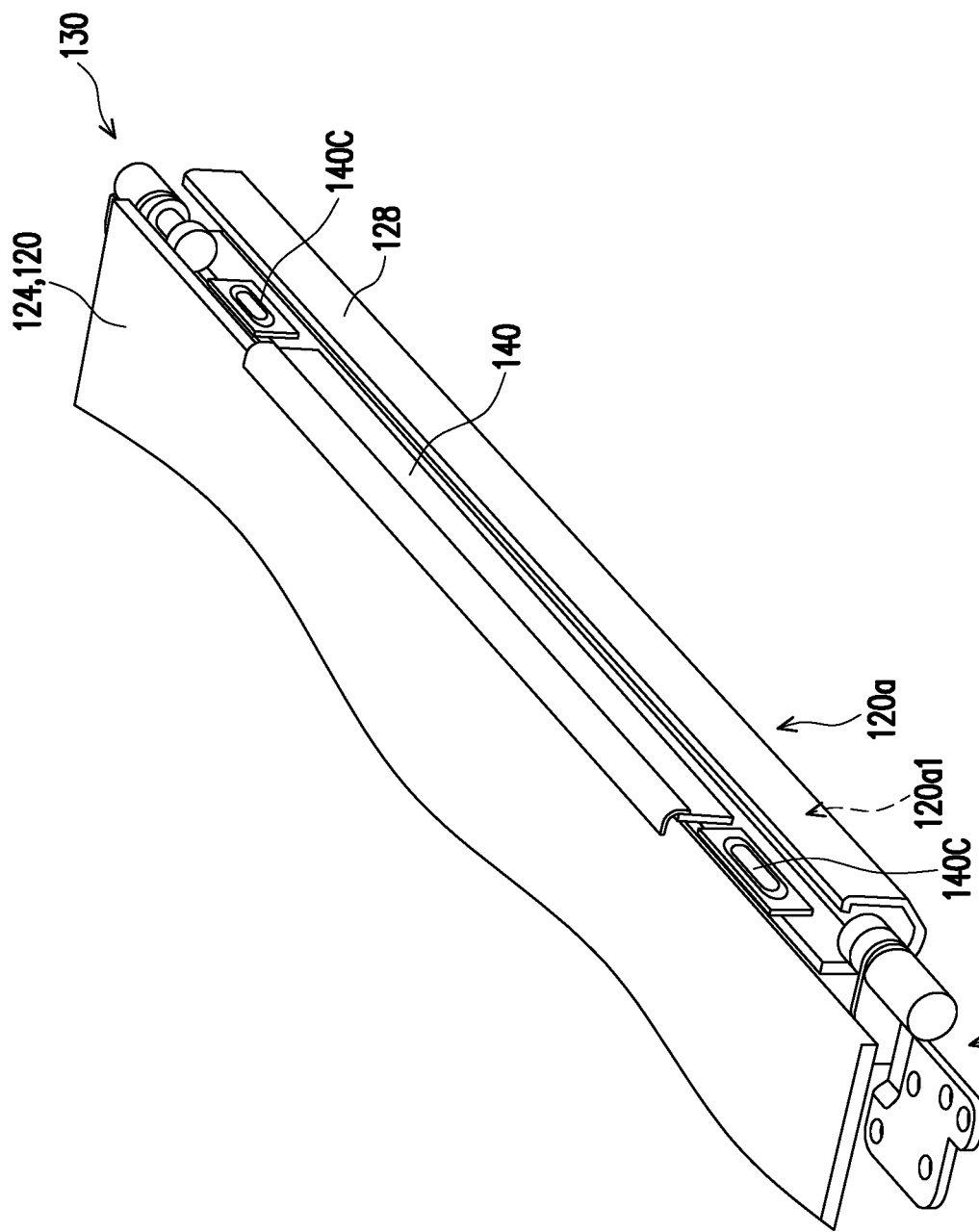
FIG. 15 is a three-dimensional view of some components of an electronic device according to another embodiment of the disclosure.
Figure 16:
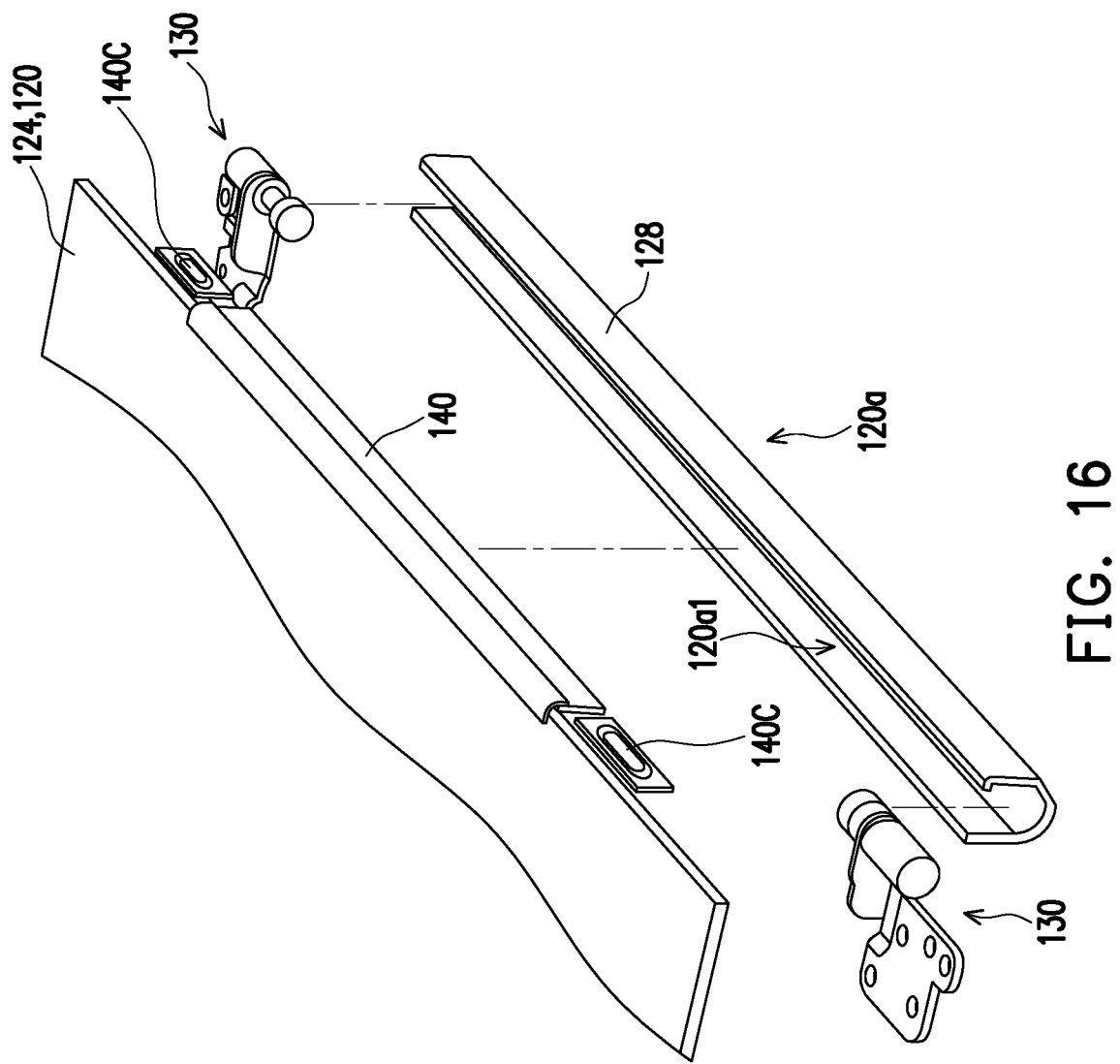
FIG. 16 is an exploded view of the electronic device in FIG. 15.

FIG. 15 is a three-dimensional view of some components of an electronic device according to another embodiment of the disclosure. FIG. 16 is an exploded view of the electronic device in FIG. 15. A difference between the embodiment shown in FIG. 15 and FIG. 16 and the embodiment shown in FIG. 3 and FIG. 4 lies in that, the electronic device in FIG. 15 and FIG. 16 further includes at least another electronic assembly 140C (there are two electronic assemblies 140B shown in the figure), and the electronic assembly 140C is, for example, a speaker and is disposed between the two hinges 130 to be located inside the masking portion 120a. A fixation manner of the electronic assembly 140C may be the same as or similar to that of the electronic assembly 140 in any one of the foregoing embodiments, and details are not described herein again.

Figure 17:
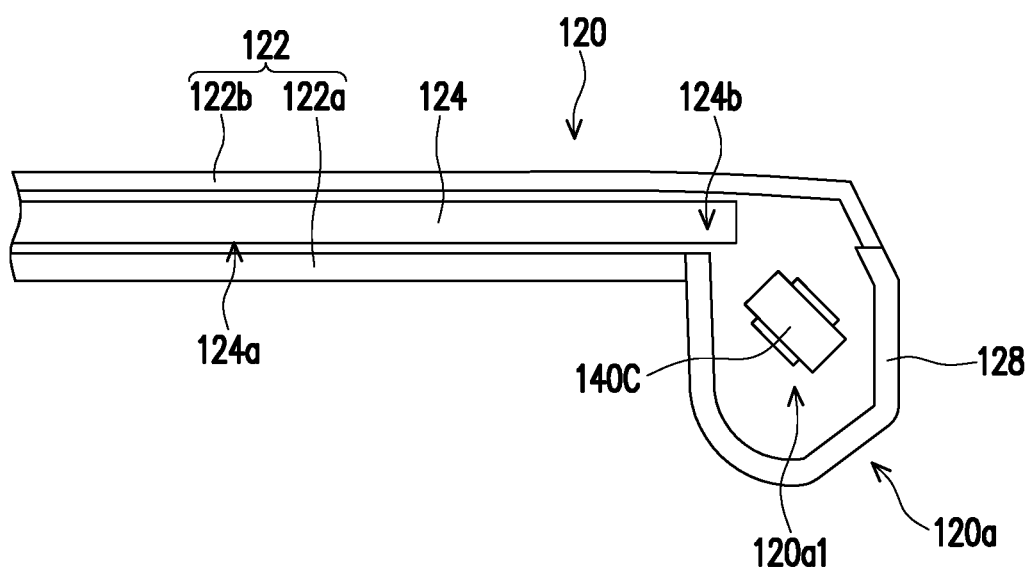
FIG. 17 is an enlarged partial view of the electronic device in FIG. 15.

FIG. 17 is an enlarged partial view of the electronic device in FIG. 15. Further, as shown in FIG. 17, the electronic assembly 140C may be set to have an appropriate inclination in the masking portion 120a, to enable the electronic assembly 140C to face a position of a user when the second body 120 is expanded. Therefore, compared with a case in which a speaker cannot easily make a sound at an angle toward a user because the speaker is usually disposed on a host (for example, the first body 110 described above) of an electronic device, the design manner of the present embodiment can provide a better sound effect. In addition, the speaker (the electronic assembly 140C) and the control circuit board (the electronic assembly 140) are jointly secured inside the masking portion 120a, so that manufacturing costs can be reduced by using a same fixation structure for fixation.

In other embodiments, the electronic assembly may be alternatively a button, a camera lens, a gesture sensor, or any other type of electronic assembly. This is not limited in the disclosure.

Based on the above, in the electronic device provided in one or more embodiments of the disclosure, the electronic assembly is disposed between the two hinges, so that the electronic assembly is accommodated in an existing internal space of the electronic device. As such, the electronic assembly is arranged in a way not to increase the overall size of the electronic device.

It will be apparent to those skilled in the art that various modifications and variations can be made to the disclosed embodiments without departing from the scope or spirit of the disclosure. In view of the foregoing, it is intended that the disclosure covers modifications and variations provided that they fall within the scope of the following claims and their equivalents.

What is claimed is:

1. An electronic device, comprising: a first body; a second body comprises a back cover, a front frame, and a display panel is disposed between the back cover and the front frame and is exposed by the front frame; an edge of the back cover extends beyond an edge of the front frame in a first direction; two hinges, connected between the first body and the second body, wherein the first body and the second body are adapted to rotate relatively through the two hinges; and at least one electronic assembly, electronically connected to the display panel in the second body and located between the two hinges; a hinge cover comprises a substantially U-shaped receiving groove; opposing edges of the receiving groove are attached to the edges of the back cover and the front frame to recess the two hinges on both ends of the receiving groove; the at least one electronic assembly comprises an L-shaped control circuit board located between the two hinges and extends toward a bottom end of the hinge cover in a second direction substantially perpendicular to the first direction.

2. The electronic device according to claim 1, wherein the L-shaped control circuit board comprises a control circuit board and a flexible printed circuit, and two ends of the flexible printed circuit are respectively connected to the control circuit board and the display panel.

3. The electronic device according to claim 2, wherein a region between the two ends of the flexible printed circuit is separated from the control circuit board.

4. The electronic device according to claim 2, wherein the control circuit board bends relative to the display panel through single bending of the flexible printed circuit.

5. The electronic device according to claim 2, wherein an extension length of the flexible printed circuit from the display panel to the control circuit board is less than or equal to an extension length of the control circuit board along a direction away from the flexible printed circuit.

6. The electronic device according to claim 2, wherein each side edge of the control circuit board is a flat surface.

7. The electronic device according to claim 2, wherein the control circuit board comprises a through hole, and the flexible printed circuit does not penetrate the through hole.

8. The electronic device according to claim 2, wherein an angle between an extension direction of the control circuit board and an extension direction of the display panel is 45 degrees to 100 degrees.

9. The electronic device according to claim 2, wherein the control circuit board comprises a top edge and a bottom edge, the top edge is close to the display panel, and the bottom edge is away from the display panel.

10. The electronic device according to claim 9, wherein the flexible printed circuit is connected to the display panel from the control circuit board through the top edge.

11. The electronic device according to claim 1, wherein the control circuit board is secured to the front frame.

12. The electronic device according to claim 2, wherein the control circuit board comprises a display control panel.

13. The electronic device according to claim 2, wherein the display panel comprises a touch panel.

14. The electronic device according to claim 13, wherein the control circuit board comprises a touch control board.

15. The electronic device according to claim 2, wherein the second body comprises a lock assembly connected to the display panel, and the control circuit board is locked to the lock assembly.

16. The electronic device according to claim 15, wherein the lock assembly is L-shaped.

17. The electronic device according to claim 16, wherein the lock assembly bends at an angle of 45 degrees to 100 degrees.

18. The electronic device according to claim 11, wherein the front frame comprises a main housing, and the hinge cover is connected to the main housing.

19. The electronic device according to claim 18, wherein the control circuit board is attached to or engaged with the hinge cover.

20. The electronic device according to claim 18, wherein the control circuit board is attached to or engaged with the main housing.

21. The electronic device according to claim 2, wherein the second body comprises a receiving groove configured to receive the control circuit board, the flexible printed circuit, and at least a portion of the two hinges.

22. The electronic device according to claim 21, wherein an end of the display panel extends into the receiving groove.

23. The electronic device according to claim 1, wherein the at least one electronic assembly comprises a button, an antenna, a speaker, a camera lens, or a gesture sensor.

24. The electronic device according to claim 1, wherein the first body is a logic unit or a stand.

25. The electronic device according to claim 2, wherein a side end face of the control circuit board overlaps side end faces of the two hinges.

* * * * *